United States Patent [19]

Escobosa

[11] Patent Number: 5,619,196

[45] Date of Patent: Apr. 8, 1997

[54] SINGLE WIRE KEYBOARD ENCODE AND DECODE CIRCUIT

[75] Inventor: Marcus Escobosa, Anaheim, Calif.

[73] Assignee: Universal Electronics Inc., Twinsburg, Ohio

[21] Appl. No.: 580,162

[22] Filed: Dec. 28, 1995

[51] Int. Cl.$^6$ .................................................... H03K 17/94
[52] U.S. Cl. ................................ 341/22; 341/26; 341/33; 340/870.38
[58] Field of Search ................................ 341/20, 22, 25, 341/26, 29, 33; 340/870.38

[56] References Cited

U.S. PATENT DOCUMENTS

| | | | |
|---|---|---|---|
| 4,015,254 | 3/1977 | Strandt | 341/22 |
| 4,817,010 | 3/1989 | Dobbins | 341/25 |
| 4,987,372 | 1/1991 | Ofori-Tenkorang et al. | 340/870.38 |

Primary Examiner—Jeffery Hofsass
Assistant Examiner—Andrew Hill
Attorney, Agent, or Firm—Thomas Vigil; Mark R. Galis; Gary R. Jarosik

[57] ABSTRACT

A circuit for encoding and decoding key input data from a matrix of switches with a single transmission wire. The circuit for encoding and decoding key input data with a single transmission wire includes a control circuit, a charge storage circuit and a keyboard matrix circuit. The keyboard matrix circuit is composed of a group of resistors connected in series. Each resistor is coupled to ground via a manually actuated switch. When one of the switches is actuated or closed the switch provides an electrical path to ground through the resistors that precede the switch and shorts the resistors that follow the switch. When one of the switches is closed the charge stored on the charge storage circuit dissipates through the electrical path to ground provided by the actuated switch, at a rate related to the sum of the resistance preceding the switch. The control circuit, by monitoring the time for a charge stored on the charge storage circuit to dissipate through an actuated switch coupled to ground, determines which switch was actuated.

16 Claims, 1 Drawing Sheet

SINGLE WIRE KEYBOARD ENCODE AND DECODE CIRCUIT

BACKGROUND OF THE INVENTION

1. Field of the Invention

The present invention relates to a circuit for encoding and decoding key input data, such as for a remote control keyboard circuit, from a matrix of switches with a single transmission wire, including circuitry for self calibration.

2. Description of the related art including information disclosed under 37 CFR §§ 1.97–1.99.

Heretofore, various circuits for encoding the position of multiple switches in keyboard circuits for remote controls have been proposed. Several examples of analogous and non-analogous circuits for encoding and/or decoding keyboard data for remote controls are disclosed in the following U.S. Patents:

| U.S. Pat. No. | Patentee |
| --- | --- |
| 4,015,254 | Strandt |
| 4,118,700 | Leniham |
| 4,580,138 | Morrison |
| 4,695,840 | Darilek |
| 4,817,010 | Dobbins |
| 4,884,070 | Hannaford |

The Strandt, U.S. Pat. No. 4,015,254 discloses a keyboard encoding circuit utilizing an A/D converter having a group of resistors coupling in series a positive voltage reference and circuit ground. The resistors in series establish a voltage divider network from which multiple voltages are generated. A group of switches are commonly connected to the input of an analog-to-digital converter and uniquely connected to one of the multiple voltages generated by the voltage divider network such that when one of the switches is closed, the voltage associated with the switch is applied to the input of the analog-to-digital converter which decodes which switch was pressed.

The Leniham, U.S. Pat. No. 4,118,700 discloses a circuit with single wire transmission of multiple switch operations. Each of a plurality of switches is connected in parallel with an impedance and the switches are coupled to form a series circuit. A reference voltage is coupled to one end of the series circuit with a termination impedance coupled to the other end to form a voltage divider. Operating a combination of switches will produce a divided voltage which is coupled to an analog-to-digital converter to decode the combination of switches operated.

The Morrison, U.S. Pat. No. 4,580,138 discloses a circuit for monitoring the state of each of a group of switches. Each switch is connected in parallel with a resistor. All of the switches are connected in series, with each end of the series string of switches being connected to an analog-to-digital converter for decoding the combination of switches depressed. The resistor values are computed by multiplying powers of 2 with a base resistor value. By computing the resistor values this way, each combination of switch closures will result in a unique resistance seen by the analog-to-digital converter.

The Darilek, U.S. Pat. No. 4,695,840 discloses a circuit for determining the position of a group of remote switches using duty cycle modulation. Each switch is connected in series with a resistor. Each series combination switch and resistor is connected in parallel with all of the other series switch and resistor combinations. The resistor values are computed by multiplying powers of 2 with a base resistor value. The group of remote switches are used to set the current for a constant current source. A timing mechanism, responsive to the constant current source, triggers the switching mechanism to generate a signal having a duty cycle that is dependant on the switches depressed.

The Dobbins, U.S. Pat. No. 4,817,010 discloses a circuit for switch detection and decoding for a vending machine. The circuit contains a group of resistor in series. Each end of the series group of resistors is connected to the different inputs of a 555 timer. One of the ends of the series group of resistors also is connected to a supply voltage. Connected between each adjacent pair of resistors is a switch with the other end of the switch being connected to the supply voltage. Dependant on which switch is closed a different aggregate resistance will be connected to the inputs of the 555 timer. The 555 timer generates a signal with a frequency dependant on the resistance at the inputs, which is then decoded by the microprocessor to determine which switch has been actuated.

The Hannaford, U.S. Pat. No. 4,884,070 discloses a circuit for reading the state of a plurality of switches. Each switch is connected in parallel with a resistor. All of the switches are connected in series. The ends of the series connection of switches are connected to both a constant current driver and an analog-to-digital converter. The resistors are weighted as a function of a power of the same base. When a switch is actuated the resistor in parallel with the actuated switch is shunted across, such that the value of the shunted resistor is not relevant to the aggregate resistance of the resistors/switches in series. The constant current driver produces a voltage drop across the resistors/switches in series dependant on its aggregate resistance. The voltage drop is decoded by the analog-to-digital converter to determine which combination of switches have been depressed.

SUMMARY OF THE INVENTION

According to the present invention there is provided a circuit for encoding and decoding key input data from a matrix of switches with a single transmission wire, including circuitry for self calibration.

The circuit for encoding and decoding key input data with a single transmission wire includes a control circuit, a charge storage circuit and a keyboard matrix circuit.

The keyboard matrix circuit comprises a group of resistors connected in series. Each resistor is coupled to ground via a manually actuated switch. When one of the switches is actuated or closed the switch provides an electrical path to ground through the resistors that precede the switch and shorts the resistors that follow the switch. One end of the series of resistors is coupled to both the charge storage circuit and an input/output pin of the control circuit.

When none of the switches are actuated, the charge stored on the charge storage circuit is maintained at a high logic level. When one of the switches is closed the charge stored on the charge storage circuit dissipates through the electrical path to ground provided by the actuated switch, at a rate related to the sum of the resistance preceding the switch. The control circuit, by monitoring the time for a charge stored on the charge storage circuit to dissipate through an actuated switch coupled to ground, determines which switch was actuated.

In this way a keyboard encoder and decoder circuit, preferably for use in a remote control, is realized making use of a single transmission wire as opposed to the multiple wires used on many keyboards of the prior art.

The circuit for encoding and decoding key input data from a matrix of switches with a single transmission wire additionally provides circuitry for calibrating the remaining portions of the circuit to take into account circuit timing inconsistencies for whatever reason.

Other objects and advantages of the present application will be apparent from the detailed description and drawings which follow.

DESCRIPTION OF THE PREFERRED EMBODIMENT

Figure 1:
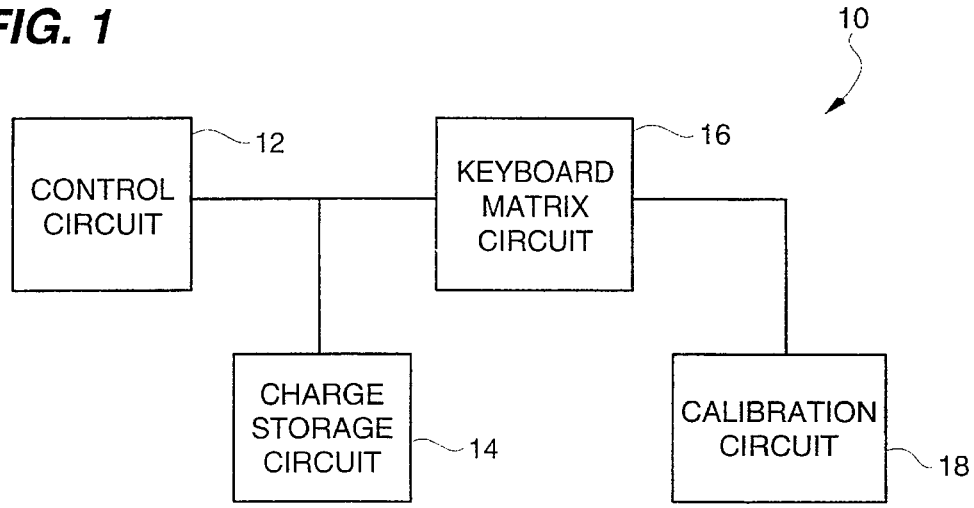
FIG. 1 is a block diagram of a circuit for encoding and decoding key input data from a matrix of switches with a single transmission wire.

Referring now to the drawings in greater detail, there is illustrated in FIG. 1 a block diagram of a circuit 10 for encoding and decoding key input data, such as for a remote control keyboard circuit, from a matrix of switches with a single transmission wire. The circuit 10 for encoding and decoding key input data from a matrix of switches with a single transmission wire includes a control circuit 12 coupled to a charge storage circuit 14 and a keyboard matrix circuit 16. The keyboard matrix circuit 16 is additionally coupled to a calibration circuit 18.

Figure 2:
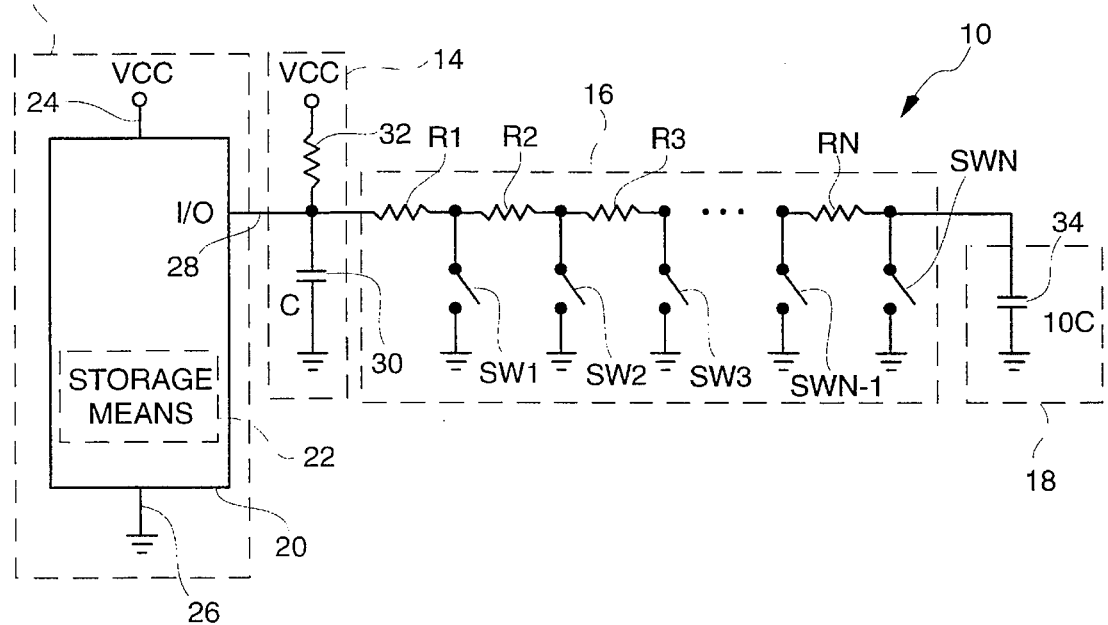
FIG. 2 is an electrical circuit schematic diagram of the circuit for encoding and decoding key input data from a matrix of switches with the single transmission wire shown in FIG. 1.

FIG. 2 is a more detailed electrical circuit schematic diagram of the circuit 10 for encoding and decoding key input data from a matrix of switches with the single transmission wire shown in FIG. 1.

The control circuit 12 includes a microprocessor 20 having a storage device 22 for storing program instructions and program data. The microprocessor 20 receives power through two supply terminals 24, 26. The first power terminal 24 is connected to the positive voltage supply, labeled VCC, and the second power terminal 26 is connected to the return voltage supply, labeled ground.

In one preferred embodiment, the storage device 22 for storing program instruction and program data is implemented using semi-conductor memory. The semi-conductor memory is of the type Random Access Memory (RAM), Read-Only Memory (ROM), or a combination of the both. The type of semi-conductor memory used is dependant on the exact method of implementation. Program instructions preferably would be located in ROM, while program data preferably would be located in both ROM and RAM.

The microprocessor 20 has an input/output terminal 28 which is coupled to both the charge storage circuit 14 and the keyboard matrix circuit 16. The charge storage circuit 14 includes a capacitor 30 and a resistor 32. The capacitor 30 couples the input/output terminal 28 of the microprocessor 20 to ground. The capacitor 30 is used to store a charge at the input/output terminal 28. The resistor 32 couples the input/output terminal 28 of the microprocessor 20 to the positive voltage supply, VCC 24. The resistor 32 weakly pulls the voltage level of the input/output terminal 28 to the voltage level of the positive voltage supply, VCC 24.

The keyboard matrix circuit 16 comprises a group of resistors, R1 through RN, connected in series. Each resistor is coupled to ground 26 via one of a group of manually actuated switches SW1 through SWN. The switches, SW1 through SWN, are normally open preventing an electrical connection with ground 26 through the switches, SW1 through SWN, in their unactuated state. The first resistor R1 in series with switch SW1 is coupled to the input/output pin 28 of the microprocessor 20.

Connected to the last resistor RN of the keyboard matrix circuit 16 is the calibration circuit 18, comprising capacitor 34. The capacitor 34, located at the end of resistor RN of the series of connected resistors, R1 through RN, provides the mechanism for calibration of circuit 10 for encoding and decoding key input data with a single transmission wire.

When none of the manually actuated switches are closed the voltage level of the input/output pin 28 of the microprocessor 20 and the charge stored on the charge storage circuit 14 is maintained at a logic level "high". The voltage level is maintained at a logic level "high" as there is no electrical path from the input/output pin 28 to ground 26. The voltage level is maintained by resistor 32 of the charge storage circuit 14 which sufficiently keeps charged the charge storage circuit 14 and compensates for any charge leakage through capacitors 30 and 34.

When one of the manually actuated switches, SW1 through SWN is actuated or closed, the switch provides an electrical path to ground 26 having an equivalent resistance equal to the sum of all the resistors in the series preceding the closed switch. All subsequent resistors are shorted out by the path to ground 26 through the closed switch. Each switch, SW1 through SWN, has a unique equivalent resistance to ground 26 when the associated switch is closed.

The charge stored on the charge storage circuit 14 has a high logic level when none of the switches, SW1 through SWN, are actuated. When one of the switches, SW1 through SWN, is actuated, a path to ground is provided and used to drain the charge stored at the charge storage circuit 14 bringing the logic level of the input/output pin 28 of microprocessor 20 to a low logic level. The low logic level at the input/output pin 28 of the microprocessor 20 signals the microprocessor 20 of the control circuit 12, that at least one of the switches, SW1 through SWN is being pressed.

The microprocessor 20 through the input/output pin 28 charges capacitor 30 of the charge storage circuit 14 to a logic level "high" and measures the time that elapses before the charge storage circuit 14 is discharged through the actuated switch, one of SW1 through SWN. Capacitor 34 of the calibration circuit 18 can be ignored as the capacitor 34 is shorted to ground via the actuated switch. The length of time for the charge storage circuit 14 to discharge is dependant on the equivalent resistance to ground resulting from the switch, one of SW1 through SWN, being actuated. As each switch, SW1 through SWN, has a unique equivalent resistance, the length of time for the charge storage circuit 14 to discharge through each of the actuated switches, SW1 through SWN, will be unique. The microprocessor 20 will be able to determine which switch, one of SW1 through SWN, is actuated by examining the discharge time of the charge storage circuit 14.

In the preferred embodiment the microprocessor 20 of the control circuit 12 will repeat the measurement until stable results are detected. In this way, inconsistent results from partially pressed or bouncing switches can be filtered out insuring accurate results.

As an example of the number of switches that can be encoded and decoded by the present circuit is as follows.

Preferably resistor 32 will be on the order of ten times greater than the series sum of the resistors, R1 through RN. If resistor 32 has a value of 10M Ohm, the sum of all the resistors of the key matrix circuit 16 should be less than 1M Ohm. If resistors, R1 through RN, each have a value of 4K ohms, the circuit 10 would work with up to 250 switches.

The circuit 10 for encoding and decoding key input data from a matrix of switches with a single transmission wire additionally provides a mechanism for calibrating the circuit. The self calibration is performed by both capacitors 30 and 34 being fully discharged through input/output pin 28 of microprocessor 20. The input/output pin 28 then quickly charges capacitor 30. Capacitor 34 remains substantially uncharged for two reasons. The first reason is capacitor 34 has a larger capacitance value, preferably at least ten times as large, taking longer to charge. The second reason is that capacitor 34 is preceded by the sum of all resistors, R1 through RN, connected in series of the key matrix circuit, which limits the current flowing to capacitor 34. Capacitor 30 is coupled directly to the input/output pin 28 of microprocessor 20.

After capacitor 30 is charged with capacitor 34 remaining substantially uncharged, the input/output pin 28 of microprocessor 20 monitors the voltage level of the charge stored on capacitor 30 and the time it makes for the charge to discharge through the sum of all of the resistors, R1 through RN, in series into capacitor 34. Because of its size, capacitor 34 effectively acts as a short to ground. The time measured by the microprocessor 20 for capacitor 30 to discharge through resistors, R1 through RN, becomes the value of the maximum discharge time and the new calibration value for subsequent key presses. In the preferred embodiment a self calibration is performed between each key press.

The preferred embodiment additionally features an input/output pin 28 of microprocessor 20 having interrupt capabilities, which is active low. In this way the microprocessor 20, while waiting for the charge stored on the charge storage circuit 14 to dissipate, can perform other tasks until it is interrupted by the voltage level of the input/output pin 28 being a value of logic level "low".

In this way a circuit 10 for encoding and decoding key input data from a matrix of switches with a single transmission wire is realized.

From the foregoing description, it will be apparent that the single wire encode and decode circuit 10 of the present invention has a number of advantages, some of which have been described above and others of which are inherent in the invention. Also it will be understood that modifications can be made to the circuit 10 described above without departing from the teachings of the invention.

I claim:

1. A circuit for encoding and decoding key input data with a single transmission wire comprising:

a control circuit including at least one input/output signal terminal, capable of producing a positive reference voltage;

a charge storage circuit coupled to said input/output signal terminal of said control circuit;

a keyboard matrix circuit including a plurality of resistors, each resistor having a first lead and a second lead, and a plurality of manually actuated switches;

said plurality of resistors being coupled together in series with said first lead of each resistor being coupled to said second lead of the preceding resistor in series, with said first lead of the first resistor being coupled to said input/output signal terminal of said control circuit, said second lead of each of said resistors being coupled to ground by one of said plurality of manually actuated switches; and said control circuit, including means, operable upon detection of one of said plurality of switches being actuated, for applying a positive reference voltage to store a charge in said charge storage circuit and means for measuring the amount of time for said charge storage circuit to discharge after said positive reference voltage is removed.

2. The circuit of claim 1, wherein said control circuit includes a microprocessor having storage means for storing program instructions and program data.

3. The circuit of claim 2, wherein said microprocessor is capable of interrupt handling and said input/output terminal of the control circuit in an input/output interrupt pin of said microprocessor.

4. The circuit of claim 1, wherein said charge storage circuit includes a capacitor coupled to ground.

5. The circuit of claim 4, wherein said charge storage circuit additionally includes a resistor coupled to the positive supply voltage.

6. The circuit of claim 5, wherein said resistor of said charge storage circuit is larger than the sum of the plurality of resistors in series of said keyboard matrix circuit.

7. The circuit of claim 6, wherein said resistor of said charge storage circuit is larger than the sum of the plurality of resistors in series of said keyboard matrix circuit by a factor of 10.

8. The circuit of claim 1, additionally including a calibration circuit coupled to said keyboard matrix circuit.

9. The circuit of claim 8, wherein said calibration circuit includes a capacitor coupled to ground.

10. The circuit of claim 9, wherein said capacitor of said calibration circuit is larger than said capacitor of said charge storage circuit.

11. The circuit of claim 10, wherein said capacitor of said calibration circuit is larger than said capacitor of said charge storage circuit by at least a factor of 10.

12. In a keyboard circuit for a remote control, the improvement residing in circuit means for encoding and decoding key press input data, said circuit means including:

signal establishing means for establishing a distinct time period signal for the depression of each key on a keyboard;

sensing means for sensing each time period signal;

coupling means for coupling said signal establishing means to said signal sensing means; and, decoding means, associated with said signal sensing means for decoding the time period of each time period signal to identify the key which has been pressed.

13. The circuit means of claim 12 wherein said coupling means comprises a single transmission line.

14. The circuit means of claim 12 including a calibration circuit coupled to said signal establishing means.

15. A method for encoding and decoding key input data in a remote control having a single transmission wire circuit comprising a control circuit, a charge circuit coupled to said control circuit, and a keyboard matrix coupled to said charge circuit, the method comprising the steps of:

detecting an actuation of a switch in said keyboard matrix;

causing said control circuit to charge said charge circuit in response to said actuation of said switch; and discharging said charge circuit through said keyboard matrix;

wherein said control circuit times discharge of said charge circuit through said keyboard matrix to determine which switch in said keyboard matrix was activated.

16. The method as recited in claim 15, further comprising the steps of:

causing said control circuit to charge said charge circuit when no switch in said keyboard matrix has been activated; and discharging said charge circuit through said keyboard matrix;

wherein said control circuit times discharge of said charge circuit through said keyboard matrix to calibrate said single wire transmission circuit.

\* \* \* \* \*